(12) United States Patent
Miller et al.

(10) Patent No.: US 7,700,938 B2
(45) Date of Patent: Apr. 20, 2010

(54) ADAPTING SHORT-WAVELENGTH LED'S FOR POLYCHROMATIC, BROADBAND, OR "WHITE" EMISSION

(75) Inventors: Thomas J. Miller, Woodbury, MN (US); Michael A. Haase, Saint Paul, MN (US); Terry L. Smith, Roseville, MN (US); Xiaoguang Sun, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 12/172,549

(22) Filed: Jul. 14, 2008

(65) Prior Publication Data

US 2008/0272362 A1    Nov. 6, 2008

Related U.S. Application Data

(63) Continuation of application No. 11/553,784, filed on Oct. 27, 2006, which is a continuation of application No. 11/009,217, filed on Dec. 9, 2004, now Pat. No. 7,402,831.

(51) Int. Cl.
*H01L 29/06* (2006.01)
(52) U.S. Cl. .......................... 257/13; 257/89
(58) Field of Classification Search ............... 257/13, 257/14, 88–90, 98, 103
See application file for complete search history.

(56) References Cited

U.S. PATENT DOCUMENTS

| | | |
|---|---|---|
| 4,527,179 A | 7/1985 | Yamazaki |
| 4,570,172 A | 2/1986 | Henry et al. |
| 4,688,068 A | 8/1987 | Chaffin et al. |
| 5,646,419 A | 7/1997 | McCaldin et al. |
| 5,851,905 A | 12/1998 | McIntosh et al. |
| 5,889,295 A | 3/1999 | Rennie et al. |
| 5,900,642 A | 5/1999 | Nakatsu et al. |
| 5,998,925 A | 12/1999 | Shimizu et al. |
| 6,147,365 A | 11/2000 | Fischer et al. |
| 6,214,116 B1 | 4/2001 | Shin |
| 6,252,896 B1 | 6/2001 | Tan et al. |

(Continued)

FOREIGN PATENT DOCUMENTS

EP        1 363 335 A2    11/2003

(Continued)

OTHER PUBLICATIONS

Chen, W. R. et al., "ZnCdSeTe-Based Orange Light-Emitting Diode," IEEE Photonics Technology Letters, vol. 14, No. 8, Aug. 2002, pp. 1061-1063.

(Continued)

*Primary Examiner*—Mark Prenty
(74) *Attorney, Agent, or Firm*—Robert S. Moshrefzadeh

(57) ABSTRACT

An adapted LED is provided comprising a short-wavelength LED and a re-emitting semiconductor construction, wherein the re-emitting semiconductor construction comprises at least one potential well not located within a pn junction. The potential well(s) are typically quantum well(s). The adapted LED may be a white or near-white light LED. The re-emitting semiconductor construction may additionally comprise absorbing layers surrounding or closely or immediately adjacent to the potential well(s). In addition, graphic display devices and illumination devices comprising the adapted LED according to the present invention are provided.

35 Claims, 4 Drawing Sheets

U.S. PATENT DOCUMENTS

| | | | |
|---|---|---|---|
| 6,265,734 B1 | 7/2001 | Fischer et al. | |
| 6,303,404 B1 | 10/2001 | Moon et al. | |
| 6,337,536 B1 | 1/2002 | Matsubara et al. | |
| 6,372,536 B1 | 4/2002 | Fischer et al. | |
| 6,504,171 B1 | 1/2003 | Grillot et al. | |
| 6,548,834 B2 * | 4/2003 | Sugawara et al. | 257/90 |
| 6,734,467 B2 | 5/2004 | Schlereth et al. | |
| 6,825,498 B2 | 11/2004 | Lai et al. | |
| 6,837,605 B2 | 1/2005 | Reill | |
| 7,064,354 B2 | 6/2006 | Chen | |
| 7,075,116 B2 | 7/2006 | Okazaki | |
| 7,129,526 B2 | 10/2006 | Fujiwara | |
| 7,141,445 B2 * | 11/2006 | Sugawara et al. | 438/41 |
| 7,223,998 B2 | 5/2007 | Schwach et al. | |
| 7,247,884 B2 | 7/2007 | Shibata et al. | |
| 7,402,831 B2 | 7/2008 | Miller et al. | |
| 2001/0042861 A1 | 11/2001 | Kan | |
| 2002/0041148 A1 | 4/2002 | Cho et al. | |
| 2002/0134989 A1 | 9/2002 | Yao et al. | |
| 2002/0139984 A1 | 10/2002 | Sugawara et al. | |
| 2002/0167014 A1 | 11/2002 | Schlereth et al. | |
| 2003/0006430 A1 | 1/2003 | Shibata et al. | |
| 2003/0026306 A1 | 2/2003 | Ohkubo et al. | |
| 2003/0161369 A1 | 8/2003 | Chang et al. | |
| 2004/0056256 A1 | 3/2004 | Bokor et al. | |
| 2004/0061102 A1 | 4/2004 | Tansu et al. | |
| 2006/0081858 A1 | 4/2006 | Lin et al. | |
| 2007/0045609 A1 | 3/2007 | Saxler | |

FOREIGN PATENT DOCUMENTS

| | | |
|---|---|---|
| EP | 1 381 091 A2 | 1/2004 |
| EP | 1 469 516 A1 | 10/2004 |
| JP | 11-274558 | 10/1999 |
| JP | 2004-072047 | 3/2004 |
| WO | WO 00/76005 | 12/2000 |
| WO | WO 01/66997 A2 | 9/2001 |
| WO | WO 02/097902 A1 | 12/2002 |

OTHER PUBLICATIONS

Chen, W. R. et al., "ZnSe-Based Mixed Color LEDs," IEEE Photonics Technology Letters, vol. 16, No. 5, May 2004, pp. 1259-1261.

Dalmasso et al., "Injection Dependence of the Electroluminescence Spectra of Phosphor Free GaN-Based White Light Emitting Diodes", Physics Status Solidi (Sa) vol. 192, No. 1, Jul. 1, 2003, pp. 139-143.

Damilano et al., "Monolithic White Light Emitting Diodes Based on InGaN/GaN Multiple-Quantum Wells", Japanese Journal of Applied Physics, vol. 40, No. 9, Sep. 15, 2001, pp. L918-L920.

Kroemer, "Quantum Mechanics for Engineering, Materials Science and Applied Physics", (Prentice Hall, Englewood Cliffs, New Jersey), 1994, pp. 54-63.

Luo et al., "Patterned Three-Color ZnCdSe/ZnCdMgSe Quantum-Well Structures for Integrated Full-Color and White Light Emitters", Applied Physics Letters, vol. 77, No. 26, Dec. 25, 2000, pp. 4259-4261.

Reuscher et al., "ZnSe/BeTe Type-II Leds Emitting Between 640 and 515 nm", Journal of Crystal Growth, vols. 214/215, Jun. 11, 2000, pp. 1071-1074.

Yamada et al., "Phosphor Free High-Luminous-Efficiency White Light-Emitting Diodes Composed of InGaN Multi-Quantum Well", Japanese Journal of Applied Physics, vol. 41, No. 3A, Mar. 1, 2002, pp. L246-L248.

Zory, ed., "Quantum Well Lasers", Academic Press, San Diego, California, 1993, pp. 72-79.

Murakami et al., "Proposal of Optically Pumped Tunable Surface Emitting Laser," Jpn. J. Appl. Phys., vol. 40, pp. L935-L936 (2001).

Logue et al., "Optical gain in (Zn, Cd) Se-Zn(S, Se) quantum wells," J. Opt. Soc. Am. B, vol. 15, No. 4, pp. 1295-1304 (Apr. 1998).

Abram, et al, "Narrow linewidth operation of a tunable optically pumped semiconductor laser," Optics Express, vol. 12, No. 22, pp. 5434-5439 (Nov. 1, 2004).

Fang, et al. "A Continuous-Wave Hybrid AlGaInAs-Silicon Evanescent Laser," IEEE Photonics Technology Letters, vol. 18, No. 10, pp. 1143-1145 (May 15, 2006).

* cited by examiner

ADAPTING SHORT-WAVELENGTH LED'S FOR POLYCHROMATIC, BROADBAND, OR "WHITE" EMISSION

CROSS REFERENCE TO RELATED APPLICATIONS

This application is a continuation of U.S. application Ser. No. 11/553,784, filed Oct. 27, 2006, which is a continuation of U.S. application Ser. No. 11/009,217 filed Dec. 9, 2004, now issued as U.S. Pat. No. 7,402,831, the disclosure of which is incorporated by reference in their entirety herein.

FIELD OF THE INVENTION

This invention relates to adaptation of short-wavelength LED's to emit polychromatic or broadband light, which may appear as white or near-white light, by addition of a re-emitting semiconductor construction to down-convert a portion of the emitted light to longer wavelengths.

BACKGROUND OF THE INVENTION

Light emitting diodes (LED's) are solid-state semiconductor devices which emit light when an electrical current is passed between anode and cathode. Conventional LED's contain a single pn junction. The pn junction may include an intermediate undoped region; this type of pn junction may also be called a pin junction. Like non-light emitting semiconductor diodes, conventional LED's pass an electrical current much more readily in one direction, i.e., in the direction where electrons are moving from the n-region to the p-region. When a current passes in the "forward" direction through the LED, electrons from the n-region recombine with holes from the p-region, generating photons of light. The light emitted by a conventional LED is monochromatic in appearance; that is, it is generated in a single narrow band of wavelengths. The wavelength of the emitted light corresponds to the energy associated with electron-hole pair recombination. In the simplest case, that energy is approximately the band gap energy of the semiconductor in which the recombination occurs.

Conventional LED's may additionally contain one or more quantum wells at the pn junction which capture high concentrations of both electrons and holes, thereby enhancing light-producing recombination. Several investigators have attempted to produce an LED device which emits white light, or light which appears white to the 3-color perception of the human eye.

Some investigators report the purported design or manufacture of LED's having multiple quantum wells within the pn junction, where the multiple quantum wells are intended to emit light at different wavelengths. The following references may be relevant to such a technology: U.S. Pat. No. 5,851, 905; U.S. Pat. No. 6,303,404; U.S. Pat. No. 6,504,171; U.S. Pat. No. 6,734,467; Damilano et al., *Monolithic White Light Emitting Diodes Based on InGaN/GaN Multiple-Quantum Wells*, Jpn. J. Appl. Phys. Vol. 40 (2001) pp. L918-L920; Yamada et al., *Phosphor Free High-Luminous-Efficiency White Light-Emitting Diodes Composed of InGaN Multi-Quantum Well*, Jpn. J. Appl. Phys. Vol. 41 (2002) pp. L246-L248; Dalmasso et al., *Injection Dependence of the Electroluminescence Spectra of Phosphor Free GaN-Based White Light Emitting Diodes*, phys. stat. sol. (a) 192, No. 1, 139-143 (2003).

Some investigators report the purported design or manufacture of LED devices which combine two conventional LED's, intended to independently emit light at different wavelengths, in a single device. The following references may be relevant to such a technology: U.S. Pat. No. 5,851, 905; U.S. Pat. No. 6,734,467; U.S. Pat. Pub. No. 2002/0041148 A1; U.S. Pat. Pub. No. 2002/0134989 A1; and Luo et al., *Patterned three-color ZnCdSe/ZnCdMgSe quantum-well structures for integrated full-color and white light emitters*, App. Phys. Letters, vol. 77, no. 26, pp. 4259-4261 (2000).

Some investigators report the purported design or manufacture of LED devices which combine a conventional LED element with a chemical phosphor, such as yttrium aluminum garnet (YAG), which is intended to absorb a portion of the light emitted by the LED element and re-emit light of a longer wavelength. U.S. Pat. No. 5,998,925 and U.S. Pat. No. 6,734, 467 may be relevant to such a technology.

Some investigators report the purported design or manufacture of LED's grown on a ZnSe substrate n-doped with I, Al, Cl, Br, Ga or In so as to create fluorescing centers in the substrate, which are intended to absorb a portion of the light emitted by the LED element and re-emit light of a longer wavelength. U.S. patent application Ser. No. 6,337,536 and Japanese Pat. App. Pub. No. 2004-072047 may be relevant to such a technology.

SUMMARY OF THE INVENTION

Briefly, the present invention provides an adapted LED comprising a short-wavelength LED and a re-emitting semiconductor construction, wherein the re-emitting semiconductor construction comprises at least one potential well not located within a pn junction. The potential well(s) are typically quantum well(s). In one embodiment, the re-emitting semiconductor construction additionally comprises an absorbing layer closely or immediately adjacent to a potential well. In one embodiment, the re-emitting semiconductor construction additionally comprises at least one second potential well not located within a pn junction having a second transition energy not equal to the transition energy of the first potential well. In one embodiment, the short-wavelength LED is a UV LED. In one such embodiment, the re-emitting semiconductor construction comprises at least one first potential well not located within a pn junction having a first transition energy corresponding to blue-wavelength light, at least one second potential well not located within a pn junction having a second transition energy corresponding to green-wavelength light, and at least one third potential well not located within a pn junction having a third transition energy corresponding to red-wavelength light. In one embodiment, the short-wavelength LED is a visible light LED, typically a green, blue or violet LED, more typically a green or blue LED, and most typically a blue LED. In one such embodiment, the re-emitting semiconductor construction comprises at least one first potential well not located within a pn junction having a first transition energy corresponding to yellow- or green-wavelength light, more typically green-wavelength light, and at least one second potential well not located within a pn junction having a second transition energy corresponding to orange- or red-wavelength light, more typically red-wavelength light.

In another aspect, the present invention provides a graphic display device comprising the adapted LED according to the present invention.

In another aspect, the present invention provides an illumination device comprising the adapted LED according to the present invention.

In this application:

with regard to a stack of layers in a semiconductor device, "immediately adjacent" means next in sequence without intervening layers, "closely adjacent" means next in sequence with one or a few intervening layers, and "surrounding" means both before and after in sequence;

"potential well" means a layer of semiconductor in a semiconductor device which has a lower conduction band energy than surrounding layers or a higher valence band energy than surrounding layers, or both;

"quantum well" means a potential well which is sufficiently thin that quantization effects raise the electron-hole pair transition energy in the well, typically having a thickness of 100 nm or less;

"transition energy" means electron-hole recombination energy;

"lattice-matched" means, with reference to two crystalline materials, such as an epitaxial film on a substrate, that each material taken in isolation has a lattice constant, and that these lattice constants are substantially equal, typically not more than 0.2% different from each other, more typically not more than 0.1% different from each other, and most typically not more than 0.01% different from each other; and "pseudomorphic" means, with reference to a first crystalline layer of given thickness and a second crystalline layer, such as an epitaxial film and a substrate, that each layer taken in isolation has a lattice constant, and that these lattice constants are sufficiently similar so that the first layer, in the given thickness, can adopt the lattice spacing of the second layer in the plane of the layer substantially without misfit defects.

It should be understood that, for any embodiment of the present invention described herein comprising n-doped and p-doped semiconductor regions, a further embodiment should be considered as disclosed herein wherein n doping is exchanged with p doping and vice-versa.

It should be understood that, where each of "potential well," "first potential well," "second potential well" and "third potential well" are recited herein, a single potential well may be provided or multiple potential wells, which typically share similar properties, may be provided. Likewise, it should be understood that, where each of "quantum well," "first quantum well," "second quantum well" and "third quantum well" are recited herein, a single quantum well may be provided or multiple quantum wells, which typically share similar properties, may be provided.

It is an advantage of certain embodiments of the present invention to provide an LED device capable of emitting polychromatic, white or near-white light.

DETAILED DESCRIPTION

Figure 1:
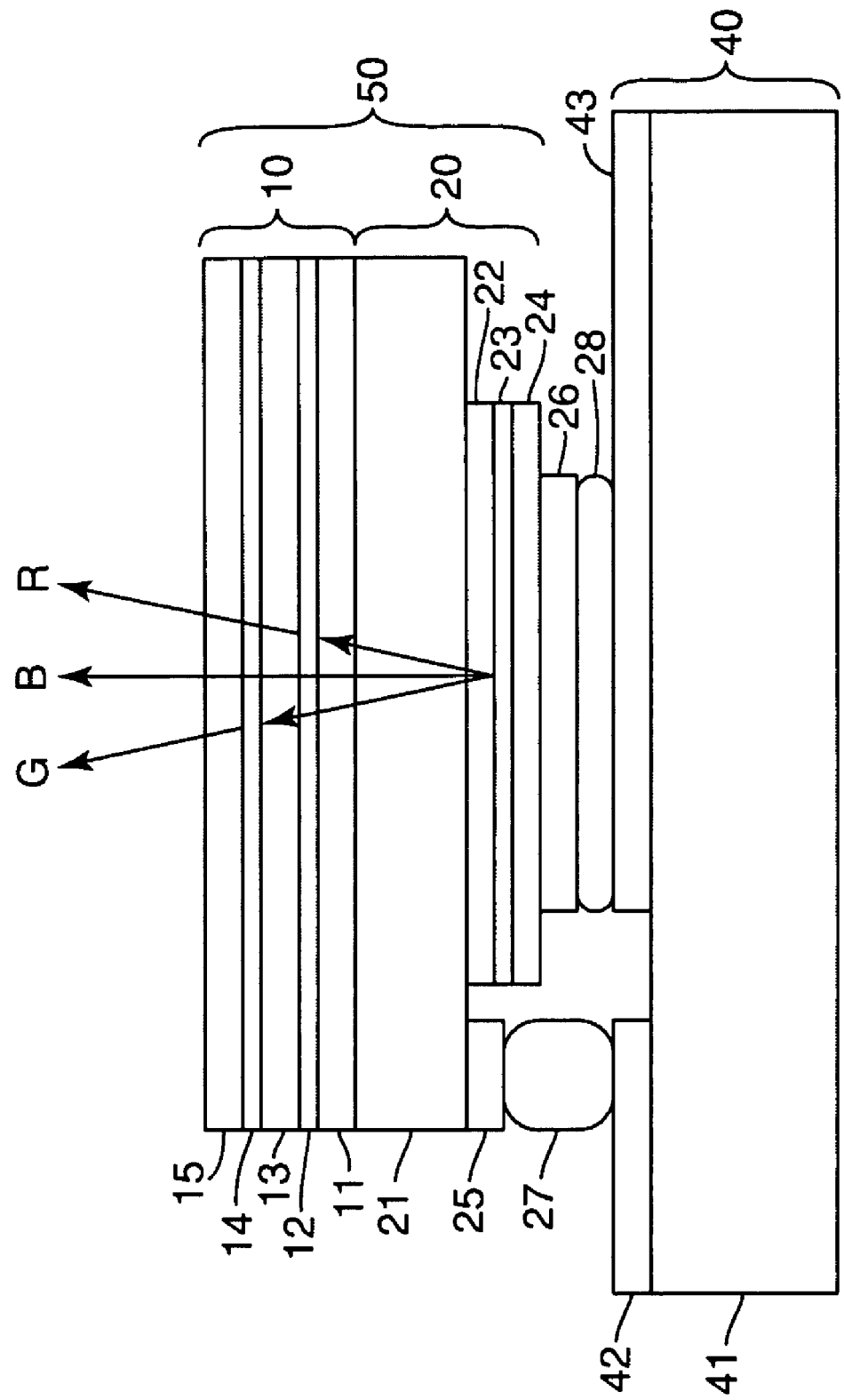
FIG. 1 is a schematic diagram of an LED according to one embodiment of the present invention.

The present invention provides an adapted LED comprising a short-wavelength LED and a re-emitting semiconductor construction, wherein the re-emitting semiconductor construction comprises at least one potential well not located within a pn junction. The potential wells are typically quantum wells. In typical operation, the short-wavelength LED emits photons in response to an electric current and the re-emitting semiconductor construction emits photons in response to the absorption of a portion of the photons emitted from the short-wavelength LED. In one embodiment, the re-emitting semiconductor construction additionally comprises an absorbing layer closely or immediately adjacent to the potential well. Absorbing layers typically have a band gap energy which is less than or equal to the energy of photons emitted by the short-wavelength LED and greater than the transition energy of the potential wells of the re-emitting semiconductor construction. In typical operation the absorbing layers assist absorption of photons emitted from the short-wavelength LED. In one embodiment, the re-emitting semiconductor construction additionally comprises at least one second potential well not located within a pn junction having a second transition energy not equal to the transition energy of the first potential well. In one embodiment, the short-wavelength LED is a UV LED. In one such embodiment, the re-emitting semiconductor construction comprises at least one first potential well not located within a pn junction having a first transition energy corresponding to blue-wavelength light, at least one second potential well not located within a pn junction having a second transition energy corresponding to green-wavelength light, and at least one third potential well not located within a pn junction having a third transition energy corresponding to red-wavelength light. In one embodiment, the short-wavelength LED is a visible light LED, typically a green, blue or violet LED, more typically a green or blue LED, and most typically a blue LED. In one such embodiment, the re-emitting semiconductor construction comprises at least one first potential well not located within a pn junction having a first transition energy corresponding to yellow- or green-wavelength light, more typically green-wavelength light, and at least one second potential well not located within a pn junction having a second transition energy corresponding to orange- or red-wavelength light, more typically red-wavelength light. The re-emitting semiconductor construction may comprise additional potential wells and additional absorbing layers.

The adapted LED according to the present invention may be composed of any suitable semiconductors, including Group IV elements such as Si or Ge (other than in light-emitting layers), III-V compounds such as InAs, AlAs, GaAs, InP, AlP, GaP, InSb, AlSb, GaSb, and alloys thereof, II-VI compounds such as ZnSe, CdSe, BeSe, MgSe, ZnTe, CdTe, BeTe, MgTe, ZnS, CdS, BeS, MgS and alloys thereof, or alloys of any of the above. Where appropriate, the semiconductors may be n-doped or p-doped by any suitable method or by inclusion of any suitable dopant. In one typical embodiment, the short wavelength LED is a III-V semiconductor device and the re-emitting semiconductor construction is a II-VI semiconductor device.

Figure 3:
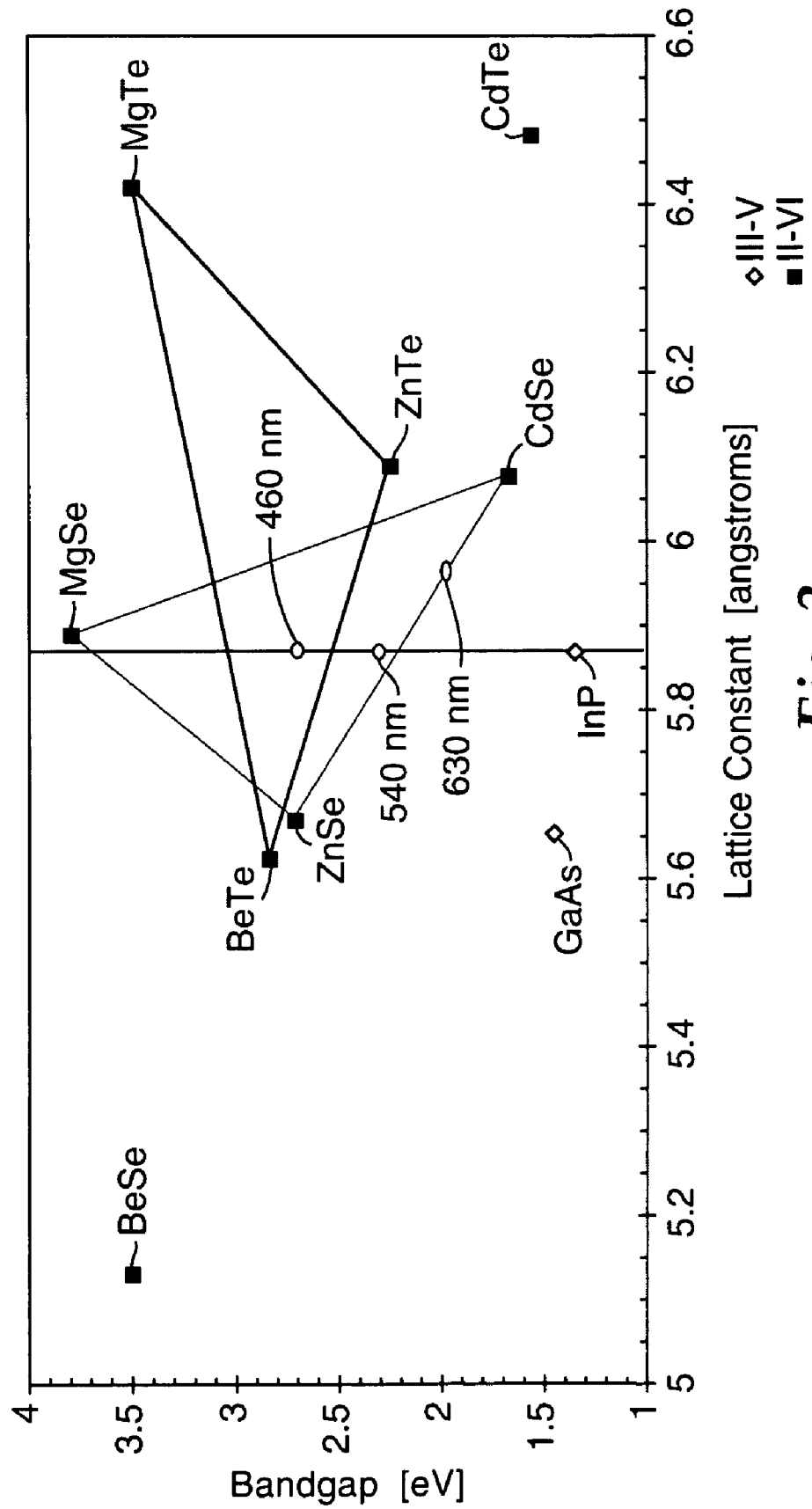
FIG. 3 is a graph indicating lattice constant and band gap energy for a variety of II-VI binary compounds and alloys thereof.

In one embodiment of the present invention, the compositions of the various layers of the components of the adapted LED are selected in light of the following considerations. Each layer typically will be pseudomorphic to the substrate at the thickness given for that layer or lattice matched to the substrate. Alternately, each layer may be pseudomorphic or lattice matched to immediately adjacent layers. Potential well layer materials and thicknesses are typically chosen so as to provide a desired transition energy, which will correspond to the wavelength of light to be emitted from the quantum well. For example, the points labeled 460 nm, 540 nm and 630 nm in FIG. 3 represent Cd(Mg)ZnSe alloys having lattice constants close to that for an InP substrate (5.8687 Angstroms or 0.58687 nm) and band gap energies corresponding to wavelengths of 460 nm (blue), 540 nm (green) and 630 nm (red). Where a potential well layer is sufficiently thin that quantization raises the transition energy above the bulk band gap energy in the well, the potential well may be regarded as a quantum well. The thickness of each quantum well layer will determine the amount of quantization energy in the quantum well, which is added to the bulk band gap energy to determine the transition energy in the quantum well. Thus, the wavelength associated with each quantum well can be tuned by adjustment of the quantum well layer thickness. Typically thicknesses for quantum well layers are between 1 nm and 100 nm, more typically between 2 nm and 35 nm. Typically the quantization energy translates into a reduction in wavelength of 20 to 50 nm relative to that expected on the basis of the band gap energy alone. Strain in the emitting layer may also change the transition energy for potential wells and quantum wells, including the strain resulting from the imperfect match of lattice constants between pseudomorphic layers.

Techniques for calculating the transition energy of a strained or unstrained potential well or quantum well are known in the art, e.g., in Herbert Kroemer, *Quantum Mechanics for Engineering, Materials Science and Applied Physics* (Prentice Hall, Englewood Cliffs, N.J., 1994) at pp. 54-63; and Zory, ed., *Quantum Well Lasers* (Academic Press, San Diego, Calif., 1993) at pp. 72-79; both incorporated herein by reference.

Any suitable emission wavelengths may be chosen, including those in the infrared, visible, and ultraviolet bands. In one embodiment of the present invention, the emission wavelengths are chosen so that the combined output of light emitted by the adapted LED creates the appearance of any color that can be generated by the combination of two, three or more monochromatic light sources, including white or near-white colors, pastel colors, magenta, cyan, and the like. In another embodiment, the adapted LED according to the present invention emits light at an invisible infrared or ultraviolet wavelength and at a visible wavelength as an indication that the device is in operation. Typically the short-wavelength LED emits photons of the shortest wavelength, so that photons emitted from the short-wavelength LED have sufficient energy to drive the potential wells in the re-emitting semiconductor construction.

FIG. 1 is a schematic diagram of an adapted LED according to one embodiment of the present invention. Adapted LED 50 includes short-wavelength LED 20 and re-emitting semiconductor construction 10. Re-emitting semiconductor construction 10 may be attached to the emitting surface of short-wavelength LED 20 by any suitable method, including the use of adhesive or welding materials, pressure, heat or combinations thereof. In the depicted embodiment, adapted LED 50 is flip-chip mounted on header 40. Solder contacts 27 and 28 maintain electrical contact between LED electrodes 25 and 26 and header traces 42 and 43, respectively. Short-wavelength LED 20 is typically a UV wavelength LED or a visible wavelength LED. Where short-wavelength LED 20 is a visible wavelength LED, it typically a green, blue or violet wavelength LED and most typically a blue or violet wavelength LED. Short-wavelength LED 20 may comprise any suitable components. In the depicted embodiment, short-wavelength LED 20 comprises electrical contacts 25 and 26, a transparent base layer 21, and functional layers 22, 23 and 24. Functional layers 22, 23 and 24 may represent any suitable LED construction but typically represent a pn junction, including p- and n-doped semiconductors 22 and 24 and a light-emitting region 23 which may comprise one or more quantum wells. A re-emitting semiconductor construction 10 according to the present invention is mounted on the emitting surface of the short-wavelength LED 20. In the depicted embodiment, re-emitting semiconductor construction 10 comprises red quantum well layer 12, green quantum well layer 14, and intermediate layers 11, 13 and 15. In one embodiment of the present invention, intermediate layers 11, 13 and 15 include support layers and absorbing layers, as described below. In one typical embodiment, short wavelength LED 20 is a III-V semiconductor device, such as a blue-emitting GaN-based LED, and re-emitting semiconductor construction 10 is a II-VI semiconductor device.

Figure 2:
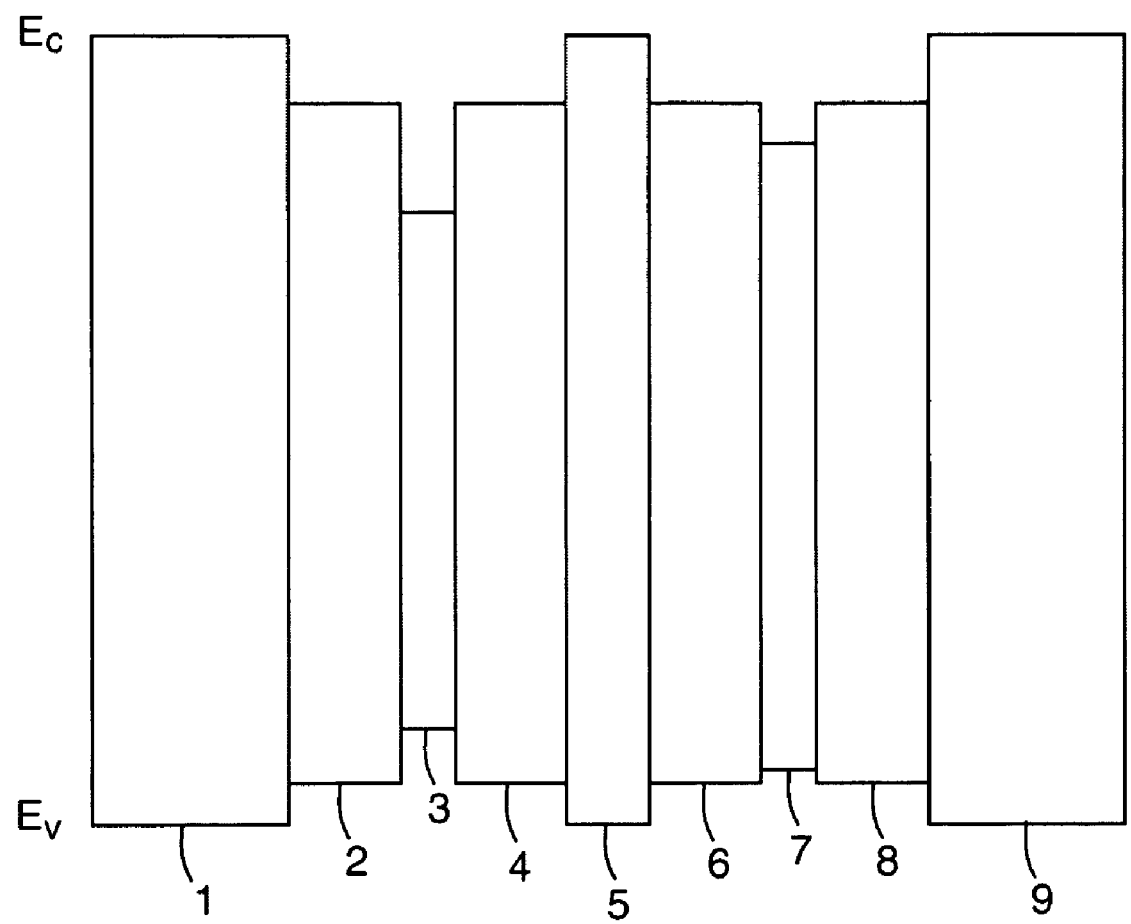
FIG. 2 is a flat-band diagram of conduction and valence bands of semiconductors in a construction according to one embodiment of the present invention. Layer thickness is not represented to scale.

FIG. 2 is a band diagram representing conduction and valence bands of semiconductors in a re-emitting semiconductor construction according to one embodiment of the present invention. Layer thickness is not represented to scale. Table I indicates the composition of layers 1-9 in this embodiment and the band gap energy ($E_g$) for that composition. This construction may be grown on an InP substrate.

TABLE I

| Layer | Composition | Band gap Energy ($E_g$) |
|---|---|---|
| 1 | $Cd_{0.24}Mg_{0.43}Zn_{0.33}Se$ | 2.9 eV |
| 2 | $Cd_{0.35}Mg_{0.27}Zn_{0.38}Se$ | 2.6 eV |
| 3 | $Cd_{0.70}Zn_{0.30}Se$ | 1.9 eV |
| 4 | $Cd_{0.35}Mg_{0.27}Zn_{0.38}Se$ | 2.6 eV |
| 5 | $Cd_{0.24}Mg_{0.43}Zn_{0.33}Se$ | 2.9 eV |
| 6 | $Cd_{0.35}Mg_{0.27}Zn_{0.38}Se$ | 2.6 eV |
| 7 | $Cd_{0.33}Zn_{0.67}Se$ | 2.3 eV |
| 8 | $Cd_{0.35}Mg_{0.27}Zn_{0.38}Se$ | 2.6 eV |
| 9 | $Cd_{0.24}Mg_{0.43}Zn_{0.33}Se$ | 2.9 eV |

Layer 3 represents a single potential well which is a red-emitting quantum well having a thickness of about 10 nm. Layer 7 represents a single potential well which is a green-emitting quantum well having a thickness of about 10 nm. Layers 2, 4, 6 and 8 represent absorbing layers, each having a thickness of about 1000 nm. Layers 1, 5 and 9 represent support layers. Support layers are typically chosen so as to be substantially transparent to light emitted from quantum wells 3 and 7 and from short-wavelength LED 20. Alternately, the device may comprise multiple red- or green-emitting potential wells or quantum wells separated by absorbing layers and/or support layers.

Figure 4:
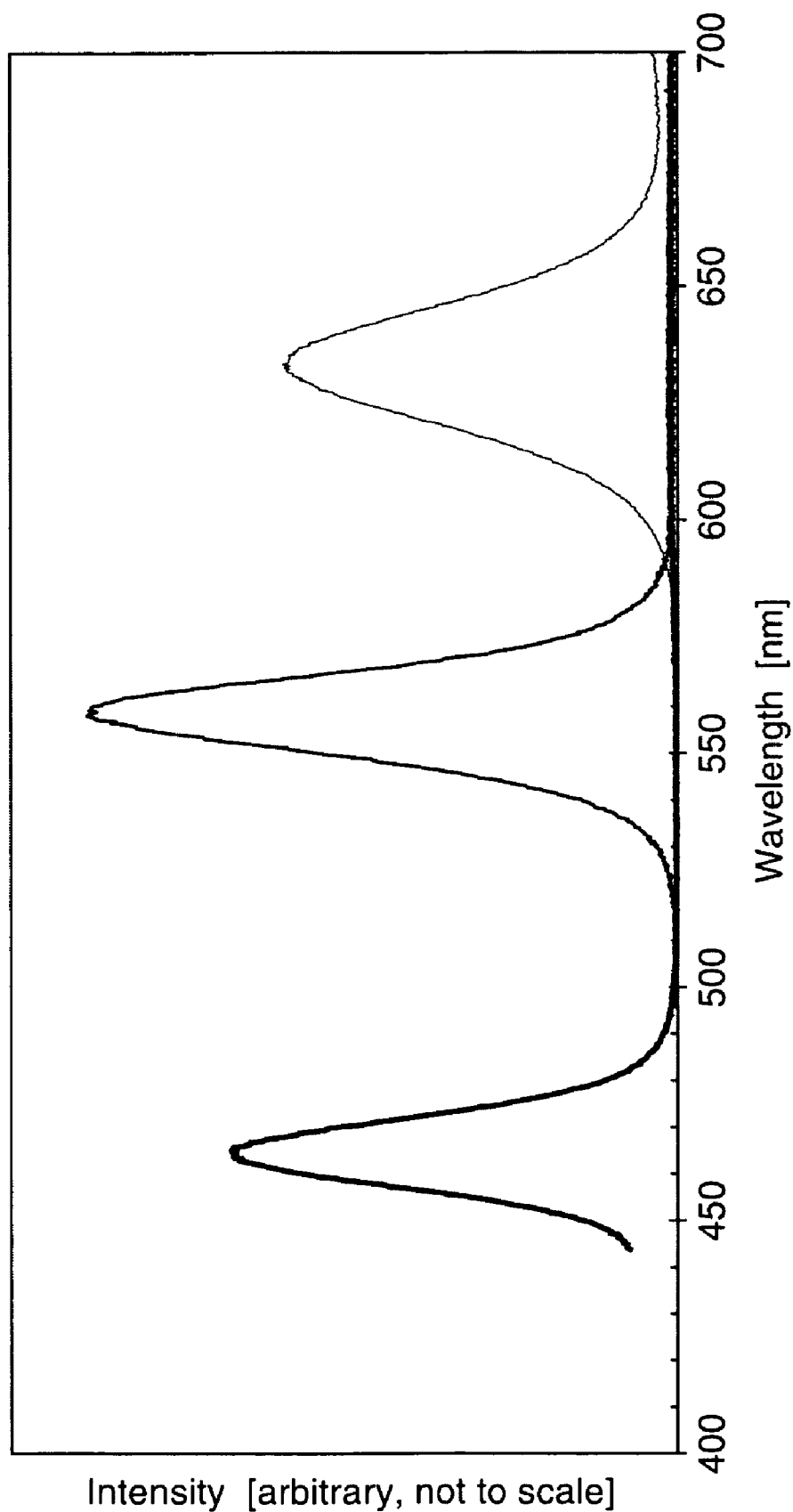
FIG. 4 is a graph representing the spectrum of light that emits from a device according to one embodiment of the present invention.

Without wishing to be bound by theory, it is believed that the embodiment of the present invention depicted in FIG. 1 operates according to the following principles: When an electrical current passes between electrodes 25 and 26, short-wavelength photons are emitted from short-wavelength LED 20. Photons traveling in the direction of the emitting surface of short-wavelength LED 20 enter re-emitting semiconductor construction 10. Photons passing through re-emitting semiconductor construction 10 may be absorbed and re-emitted from the green-emitting quantum well 7 as green-wavelength photons or from the red-emitting quantum well 3 as red-wavelength photons. The absorption of a short-wavelength photon generates an electron-hole pair which may then recombine in the quantum wells, with the emission of a photon. The polychromatic combination of blue-, green- and red-wavelength light emitted from the device may appear white or near-white in color. The intensity of blue-, green- and red-wavelength light emitted from the device may be balanced in any suitable manner, including manipulation of the number of quantum wells of each type, the use of filters or reflective layers, and manipulation of the thickness and composition of absorbing layers. FIG. 4 represents a spectrum of light that emits from one embodiment of the device according to the present invention.

Again with reference to the embodiment represented by FIG. 2, absorbing layers 2, 4, 6 and 8 may be adapted to absorb photons emitted from short wavelength LED 20 by selecting a band gap energy for the absorbing layers that is intermediate between the energy of photons emitted from short wavelength LED 20 and the transition energies of quantum wells 3 and 7. Electron-hole pairs generated by absorption of photons in the absorbing layers 2, 4, 6 and 8 are typically captured by the quantum wells 3 and 7 before recombining with concomitant emission of a photon. Absorbing layers may optionally have a gradient in composition over all or a portion of their thickness, so as to funnel or direct electrons and/or holes toward potential wells.

Where the short-wavelength LED 20 is a visible wavelength LED, layers 11-15 of re-emitting semiconductor construction 10 may be partially transparent to the light emitted from the short wavelength LED. Vector B represents a blue wavelength photon passing through re-emitting semiconductor construction 10. Vector R represents a red wavelength photon emitted from red quantum well layer 12 after absorption of a blue wavelength photon emitted from short-wavelength LED 20. Vector G represents a green wavelength photon emitted from green quantum well layer 14 after absorption of a blue wavelength photon emitted from short-wavelength LED 20. Alternately, where short-wavelength LED 20 is a UV wavelength LED, layers 11-15 of re-emitting semiconductor construction 10 may block a greater portion or substantially or completely all of the light emitted from the short wavelength LED 20, so that a greater portion or substantially or completely all of the light emitted from the adapted LED 50 is light re-emitted from re-emitting semiconductor construction 10. Where short-wavelength LED 20 is a UV wavelength LED, re-emitting semiconductor construction 10 may include red-, green- and blue-emitting quantum wells.

The adapted LED according to the present invention may comprise additional layers of conducting, semiconducting or non-conducting materials. Electrical contact layers may be added to provide a path for supply of electrical current to the short-wavelength LED. Electrical contact layers may be placed such that the current passes also through the re-emitting semiconductor construction, or such that the current does not pass through the re-emitting semiconductor construction. Light filtering layers may be added to alter or correct the balance of light wavelengths in the light emitted by the adapted LED. To improve brightness and efficiency, layers comprising a mirror or reflector may be added.

In one embodiment, the adapted LED according to the present invention is a white or near-white LED which emits light at four principal wavelengths in the blue, green, yellow and red bands. In one embodiment, the adapted LED according to the present invention is a white or near-white LED which emits light at two principal wavelengths in the blue and yellow bands.

The adapted LED according to the present invention may comprise additional semiconductor elements comprising active or passive components such as resistors, diodes, zener diodes, conventional LED's, capacitors, transistors, bipolar transistors, FET transistors, MOSFET transistors, insulated gate bipolar transistors, phototransistors, photodetectors, SCR's, thyristors, triacs, voltage regulators, and other circuit elements. The adapted LED according to the present invention may comprise an integrated circuit. The adapted LED according to the present invention may comprise a display panel or an illumination panel.

The short-wavelength LED and the re-emitting semiconductor construction which make up the adapted LED according to the present invention may be manufactured by any suitable method, which may include molecular beam epitaxy (MBE), chemical vapor deposition, liquid phase epitaxy and vapor phase epitaxy. The elements of the adapted LED according to the present invention may include a substrate. Any suitable substrate may be used in the practice of the present invention. Typical substrate materials include Si, Ge, GaAs, InP, sapphire, SiC and ZnSe. The substrate may be n-doped, p-doped, or semi-insulating, which may be achieved by any suitable method or by inclusion of any suitable dopant. Alternately, the elements of the adapted LED according to the present invention may be without a substrate. In one embodiment, elements of the adapted LED according to the present invention may be formed on a substrate and then separated from the substrate. The elements of the adapted LED according to the present invention may be joined together by any suitable method, including the use of adhesive or welding materials, pressure, heat or combinations thereof. In one embodiment, the re-emitting semiconductor construction is formed on a substrate, bonded to the short-wavelength LED, and then its substrate is removed by physical, chemical or energetic methods. Typically, the bond created is transparent. Bonding methods may include interfacial or edge bonding. Optionally, refractive index matching layers or interstitial spaces may be included.

The adapted LED according to the present invention may be a component or the critical component of a graphic display device such as a large- or small-screen video monitor, computer monitor or display, television, telephone device or telephone device display, personal digital assistant or personal digital assistant display, pager or pager display, calculator or calculator display, game or game display, toy or toy display, large or small appliance or large or small appliance display, automotive dashboard or automotive dashboard display, automotive interior or automotive interior display, marine dashboard or marine dashboard display, marine interior or marine interior display, aeronautic dashboard or aeronautic dashboard display, aeronautic interior or aeronautic interior display, traffic control device or traffic control device display, advertising display, advertising sign, or the like.

The adapted LED according to the present invention may be a component or the critical component of a liquid crystal display (LCD), or like display, as a backlight to that display. In one embodiment, the semiconductor device according to the present invention is specially adapted for use a backlight for a liquid crystal display by matching the colors emitted by the semiconductor device according to the present invention to the color filters of the LCD display.

The adapted LED according to the present invention may be a component or the critical component of an illumination device such as a free-standing or built-in lighting fixture or lamp, landscape or architectural illumination fixture, handheld or vehicle-mounted lamp, automotive headlight or taillight, automotive interior illumination fixture, automotive or non-automotive signaling device, road illumination device, traffic control signaling device, marine lamp or signaling device or interior illumination fixture, aeronautic lamp or signaling device or interior illumination fixture, large or small appliance or large or small appliance lamp, or the like; or any device or component used as a source of infrared, visible, or ultraviolet radiation.

Various modifications and alterations of this invention will become apparent to those skilled in the art without departing from the scope and principles of this invention, and it should be understood that this invention is not to be unduly limited to the illustrative embodiments set forth hereinabove.

We claim:

1. An adapted LED comprising an LED and a re-emitting semiconductor construction, wherein the re-emitting semiconductor construction comprises a first potential well having a first transition energy and an absorbing layer closely adjacent to the first potential well, the absorbing layer having a band gap energy greater than the first transition energy and smaller than an energy of a photon emitted by the LED, wherein the first transition energy corresponds to a yellow or green light, and wherein the re-emitting semiconductor construction further comprises a second potential well having a second transition energy corresponding to an orange or red light.

2. An adapted LED according to claim 1, wherein the LED is a UV, violet, blue or green LED.

3. An adapted LED according to claim 1, wherein the LED comprises a III-V semiconductor.

4. An adapted LED according to claim 1, wherein the LED comprises a GaN semiconductor.

5. An adapted LED according to claim 1, wherein the re-emitting semiconductor construction is not within a pn junction.

6. An adapted LED according to claim 1, wherein the re-emitting semiconductor construction comprises a quantum well.

7. An adapted LED according to claim 1, wherein the re-emitting semiconductor construction comprises a II-VI semiconductor.

8. An adapted LED according to claim 1, wherein the re-emitting semiconductor construction comprises a Cd(Mg)ZnSe alloy.

9. An adapted LED according to claim 1, wherein the re-emitting semiconductor construction comprises ZnSe, CdSe, MgSe, ZnS, or MgS, or an alloy thereof.

10. An adapted LED according to claim 1, wherein the re-emitting semiconductor construction comprises ZnSe, BeSe, or MgSe, or an alloy thereof.

11. An adapted LED according to claim 1, wherein the first potential well comprises a quantum well.

12. An adapted LED according to claim 1, wherein a thickness of the first potential well is 100 nm or less.

13. An adapted LED according to claim 1, wherein a thickness of the first potential well is between 2 nm and 35 nm.

14. An adapted LED according to claim 1, wherein a thickness of the first potential well is about 10 nm.

15. An adapted LED according to claim 1, wherein a thickness of the absorbing layer is about 1000 nm.

16. An adapted LED according to claim 1, wherein the re-emitting semiconductor construction is capable of re-emitting one or more of a blue, green, yellow, orange, red, and white light.

17. An adapted LED according to claim 1, wherein the absorbing layer is immediately adjacent to the first potential well.

18. An adapted LED according to claim 1, wherein the absorbing layer is adapted to generate electron-hole pairs by absorbing photons emitted by the LED, and to direct the generated electron-hole pairs toward the first potential well.

19. An adapted LED according to claim 1, wherein the absorbing layer has a gradient in composition over at least a portion of its thickness.

20. An adapted LED according to claim 1, wherein the light absorbing layer comprises a II-VI semiconductor.

21. An adapted LED according to claim 1, wherein the light absorbing layer comprises a CdMgZnSe alloy.

22. An adapted LED according to claim 1, wherein the light absorbing layer comprises ZnSe, CdSe, MgSe, ZnS, or MgS, or an alloy thereof.

23. An adapted LED according to claim 1, wherein the light absorbing layer comprises ZnSe, BeSe, or MgSe, or an alloy thereof.

24. An adapted LED according to claim 1, wherein the re-emitting semiconductor construction is capable of converting at least a portion of light emitted by the LED to a longer wavelength light.

25. An adapted LED according to claim 1, wherein the LED is bonded to the re-emitting semiconductor construction.

26. An adapted LED according to claim 1 further comprising a refractive index matching layer.

27. An adapted LED according to claim 1 further comprising a support layer substantially transparent to light emitted by the LED and the re-emitting semiconductor construction.

28. An adapted LED according to claim 27 having multiple potential wells separated by the support layer.

29. An adapted LED according to claim 27 having multiple absorbing layers separated by the support layer.

30. An adapted LED according to claim 27, wherein the support layer comprises a Cd(Mg)ZnSe alloy.

31. An adapted LED according to claim 27, wherein the support layer comprises ZnSe, CdSe, MgSe, ZnS, or MgS, or an alloy thereof.

32. An adapted LED according to claim 27, wherein the support layer comprises ZnSe, BeSe, or MgSe, or an alloy thereof.

33. An adapted LED according to claim 27, wherein the support layer is an outermost layer of the re-emitting semiconductor construction.

34. An adapted LED according to claim 1 having multiple potential wells separated by the absorbing layer.

35. An illumination device comprising an adapted LED according to claim 1.

* * * * *

UNITED STATES PATENT AND TRADEMARK OFFICE
CERTIFICATE OF CORRECTION

| | | |
|---|---|---|
| PATENT NO. | : 7,700,938 B2 | Page 1 of 1 |
| APPLICATION NO. | : 12/172549 | |
| DATED | : April 20, 2010 | |
| INVENTOR(S) | : Thomas James Miller et al. | |

It is certified that error appears in the above-identified patent and that said Letters Patent is hereby corrected as shown below:

Page 2,

Column 2 (Other Publications), Line 32, Delete "A1GaInAs" and insert -- AlGaInAs --, therefor.

Column 1,

Line 9, After "2006," insert -- now pending --.

Column 2,

Line 23, After "patent" delete "application Ser.".

Signed and Sealed this
Eighth Day of February, 2011

David J. Kappos
*Director of the United States Patent and Trademark Office*